(12) United States Patent
Liu

(10) Patent No.: US 6,906,901 B1
(45) Date of Patent: Jun. 14, 2005

(54) COOLING APPARATUS FOR INTEGRATED CIRCUIT

(75) Inventor: Chu-Kung Liu, Taipei (TW)

(73) Assignee: Twinhead International Corp., Hsintien (TW)

( * ) Notice: Subject to any disclaimer, the term of this patent is extended or adjusted under 35 U.S.C. 154(b) by 0 days.

(21) Appl. No.: 09/299,957

(22) Filed: Apr. 26, 1999

(51) Int. Cl.⁷ ............................................... H02H 5/00
(52) U.S. Cl. ..................... 361/103; 361/51; 361/106
(58) Field of Search ......................... 361/103, 51, 23, 361/24, 106

(56) References Cited

U.S. PATENT DOCUMENTS 4,842,431 A * 6/1989 Katsukawa ................. 400/719
6,043,980 A * 3/2000 Katsui ....................... 361/695

* cited by examiner

Primary Examiner—Stephen W. Jackson
(74) Attorney, Agent, or Firm—Jiawei Huang; J C Patents (57) ABSTRACT

A cooling apparatus for an integrated circuit. The cooling apparatus comprises cooling fan means, a control circuit and heat pipe means. The control circuit determines a spinning speed of the cooling fan and an operation performance mode of the integrated circuit according to the load and the temperature of the integrated circuit, the ambient temperature and a reference temperature. Within a tolerable range of the output of adder means, the heating pipe means continues dispelling heat of the integrated circuit without turning on the cooling fan. While the output of the adder means exceed the tolerable range, the fan is turned on to enforce the heat dissipation.

41 Claims, 6 Drawing Sheets

FIG. 8

COOLING APPARATUS FOR INTEGRATED CIRCUIT

BACKGROUND OF THE INVENTION

1. Field of Invention

The present invention relates to a cooling device and a control circuit thereof. More particularly, the present invention relates to a device and a control circuit for cooling an integrated circuit (IC) in the application of a microprocessor in a computer system.

2. Description of Related Art

Figure 1:
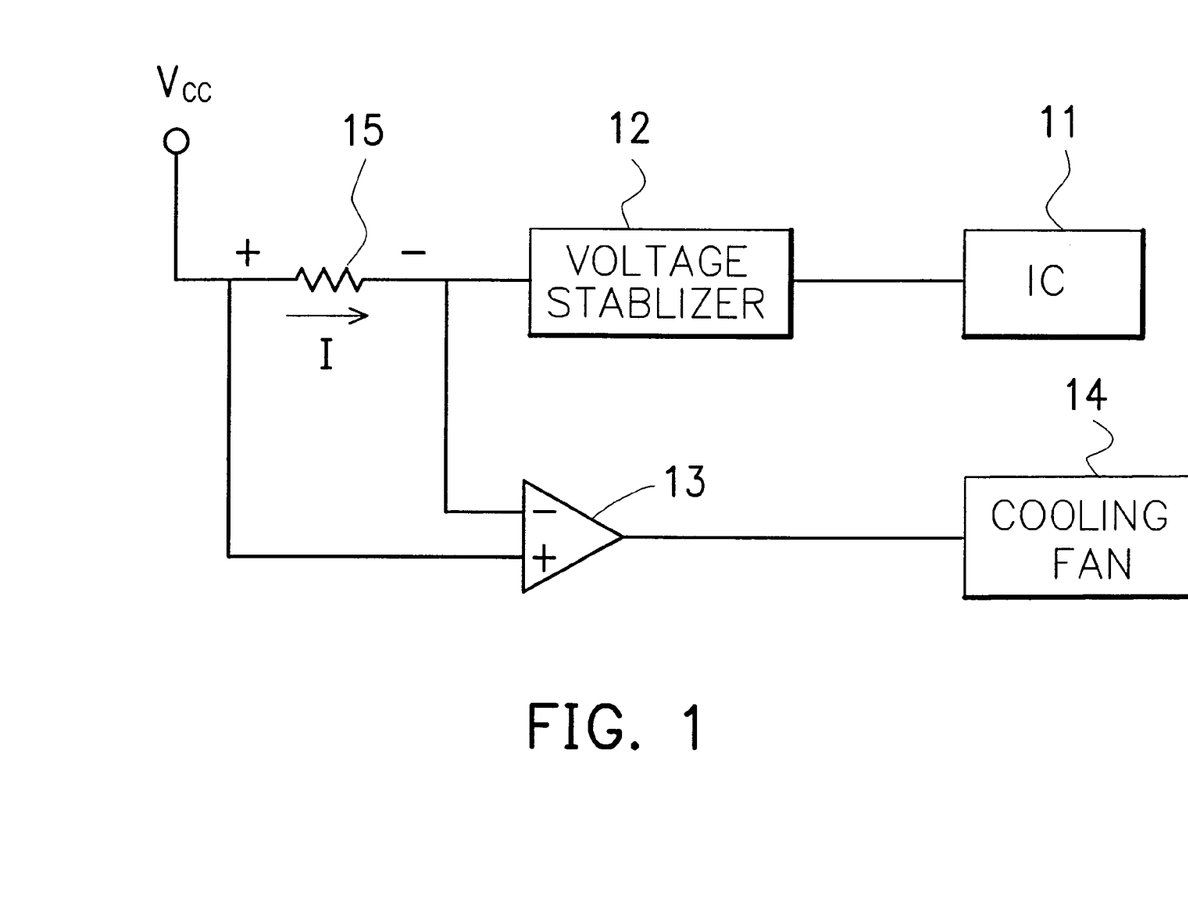
FIG. 1 is a circuit diagram showing a control circuit of a conventional cooling fan of an integrated circuit.

FIG. 1 is a circuit diagram showing a conventional cooling fan control circuit for cooling an integrated circuit. The integrated circuit 11 is connected to a voltage stabilizer 12 which supplies an operation voltage to the integrated circuit 11. The input terminal of the stabilizer 12 is connected to one terminal of a sense resistor 15 as well as the negative (−) input terminal of an operation amplifier 13. The other terminal of the sense resistor 15 is connected to a power source Vcc and the positive (+) terminal of the operation amplifier 13. The output terminal of the operation amplifier 13 is connected to a cooling fan 14. Using the above circuit connections, the current flowing through the sense resistor 15 will change according to the actual loading in the integrated circuit 11. That is, a higher current will pass through the sense resistor 15 when the loading in the integrated circuit 11 is increased. Since there is a voltage drop whenever a current flow through the sense resistor, the resulting voltage drop across the sense resistor 15 is fed into the input terminal of the operation amplifier 13 to be amplified. According to the amplified voltage drop of the loading, the spinning speed of the cooling fan can be determined as required to control the operation mode of the cooling fan.

With the system as shown in FIG. 1, while the computer system is turned off, the central processing unit (CPU, the integrated circuit) is still at a high temperature. After the computer is restarted, the cooling fan does not operate since the loading of the CPU is not large enough. The CPU is thus easily to burn out due to the high temperature.

Moreover, an output signal for the operation amplifier is continuously supplied to the cooling fan 14, thus, it causes an additional power consumption, especially in the application of notebook computer because a portable computer requires an additional battery to supply voltage to the CPU and the peripheries. The design of the conventional fan cooling apparatus will increase power consumption and reduce the lifetime of the battery. Furthermore, in case that the cooling fan is burned out, it can not be detected from the circuit design of the conventional system, and thus, the CPU easily burns out consequently.

As the portable electronic equipment has a great demand in smaller dimension and configuration, the heat dissipation design and function are very much restricted. For example, active heat dissipation devices for portable computers can only adapt those small and thin fans. Hence, the performance and efficiency of heat dissipation may be severely affected. To prevent possible mal-functioning or damages to the hardware caused by a poor heat dissipating effect, some portable computers are designed with a thermal sensor to detect internal temperature variation. As soon as the thermal sensor detects an abnormally high temperature, the system automatically lowers the system performance such as lowering the operating frequency and voltage, so that the system is under a state with a lower thermal energy and temperature.

In contrast, when the system has a good heat dissipating (for example, when the system is in an air-conditioned room or in a ventilated environment), the detected temperature is within a normal operating range. The operation performance can be enhanced to a high efficiency operation mode with a high clock of an operating frequency. However, as the temperature variation reflects a result of heat dissipation mechanism, using the thermal sensor to switch the operation clock speed is inevitably slow responsive. Thus, when the system is over heated, the thermal sensor may not perform an appropriate execution speed and good performance in time.

SUMMARY OF THE INVENTION

Accordingly, the present invention provides a cooling apparatus which can control the speed of a fan so that an integrated circuit is sufficiently cooled as requried. The fan is made rotated at a speed according to the temperature of the integrated circuit, the ambient temperature and a reference temperature.

In another aspect, the invention provides a cooling apparatus for cooling an integrated circuit such that the operating speed of the integrated circuit can be adjusted according to the temperature of the integrated circuit and overall efficiency of the cooling apparatus.

To achieve these and other advantages and in accordance with the purpose of the invention, as embodied and broadly described herein, the invention provides a cooling apparatus for cooling an integrated circuit. The cooling apparatus controls the speed of a cooling fan of the integrated circuit according to the loading of the integrated circuit, the ambient temperature, the temperature of the integrated circuit and a reference temperature. The cooling apparatus comprises at least one adder means, control means and cooling fan means.

The adder means receive a first, a second and a third voltage signals to generate a corresponding control signal. The first voltage signal corresponds to a specific loading of the integrated circuit. The second voltage signal corresponds to the difference between the temperature of the integrated circuit and the ambient temperature. The third voltage signal corresponds to the difference between the ambient air temperature and the reference temperature. The control means are connected to the adder means. Switch means are controlled by the control means according to the control signal of the adder means and the speed of the cooling fan. The cooling fan means are connected to the control means and attached to the integrated circuit. When the switch means of the cooling fan are turned on, the cooling fan starts spinning. Hence, the integrated circuit is cooled down by forced convention.

If the integrated circuit is operating within a tolerable temperature range, the cooling fan is not activated, or the operation of the integrated circuit is adjusted at a higher clock speed. Alternatively, if the ambient temperature is low, the integrated circuit can be switched to a high-speed mode or the cooling fan is turned off. However, should the temperature in the integrated circuit exceed the tolerable range such as $V_{max}$ value, the control means forward a signal to the switch means to turn on the cooling fan again.

In a second embodiment of this invention, a cooling apparatus for cooling an integrated circuit is provided. The cooling apparatus is particularly applicable for cooling the integrated circuit in a portable electronic equipment. The cooling apparatus of the integrated circuit contains at least cooling fan means, heat pipe means, and a driving circuit.

The cooling fan means are coupled to the integrated circuit to enforce dissipation of the heat generated by the integrated circuit. The cooling fan means further include a cooling fan and a heat sink. The heat pipe means are attached to the heat sink. The heat pipe means further include a first heat pipe and a second heat pipe. Both the first and the second heat pipes are used for radiating the accumulated heat in the integrated circuit away. The first and second heat pipes are in contact with the housing of the main body. Furthermore, the second heat pipe is also attached to a metallic rope. The driving circuit is used to control the speed of the cooling fan in the cooling assembly. The speed of the cooling fan is determined by the driving circuit according to the loading condition in the integrated circuit, the ambient temperature, body temperature of the integrated circuit and a reference temperature.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
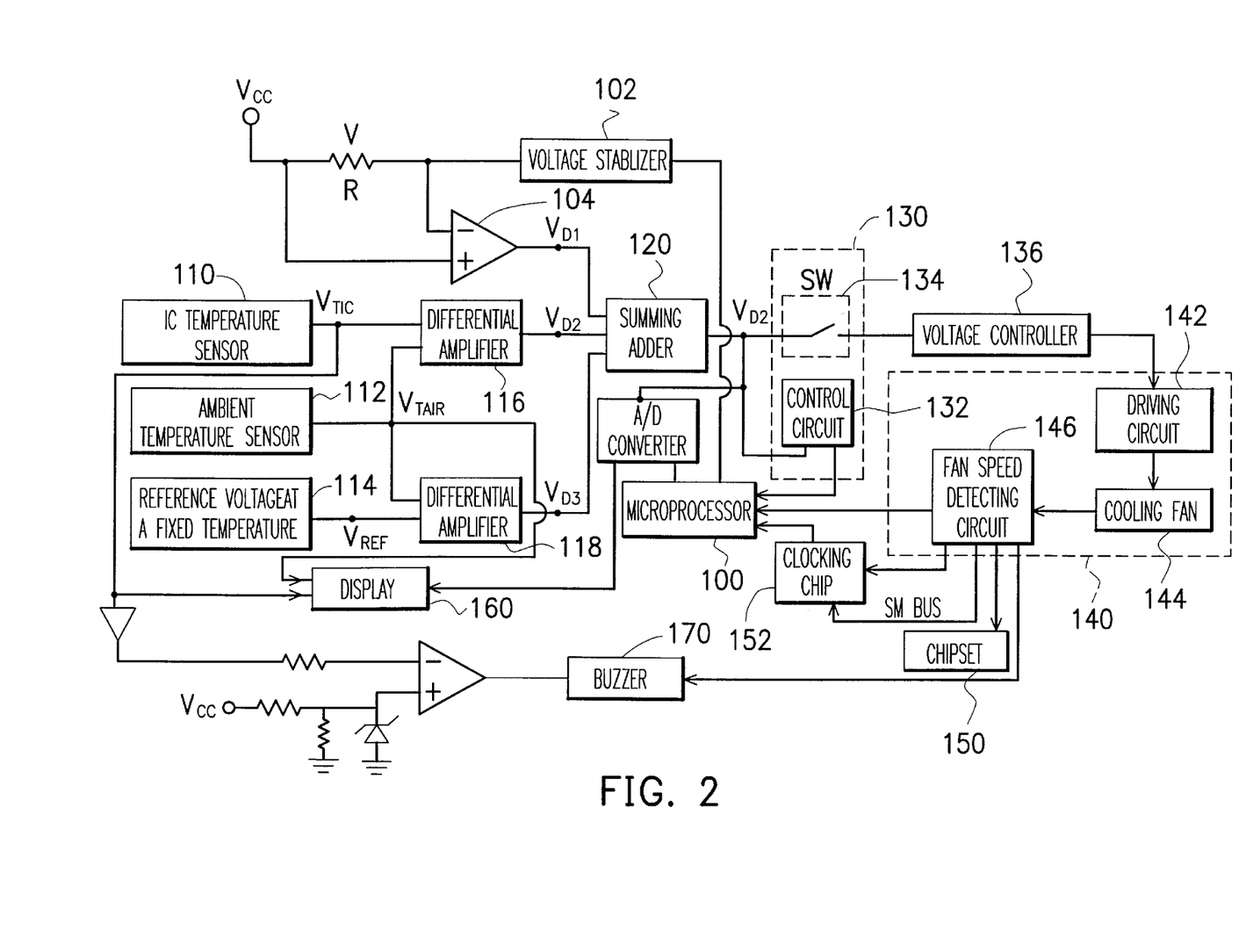
FIG. 2 is a circuit diagram showing a control circuit of a cooling fan for cooling an integrated circuit according to a first embodiment of this invention.

FIG. 2 is a circuit diagram showing a control circuit of a cooling apparatus of an integrated circuit 100 according to a first embodiment of this invention. The cooling apparatus controls the speed of the cooling fan 144 according to the loading of the integrated circuit 100, the ambient temperature $T_{air}$, the temperature $T_{IC}$ of the integrated circuit 100 and a reference temperature $T_{REF}$. The cooling apparatus contains at least an adder 120, a control means 130 and a cooling fan 140.

The adder 120 can be a weighted summer used to receive a first voltage signal $V_{D1}$, a second voltage signal $V_{D2}$ and a third voltage signal $V_{D3}$ to generate a control signal $V_{WS}$. The first voltage signal $V_{D1}$ reflects the loading of the integrated circuit 100. The second voltage signal $V_{D2}$ reflects the difference between the temperature $T_{IC}$ of the integrated circuit 100 and the ambient temperature $T_{air}$. The third voltage signal $V_{D3}$ reflects the difference between the ambient temperature $T_{air}$ and a reference temperature $T_{REF}$. The first voltage signal $V_{D1}$ is generated by a load detecting circuit. The load detecting circuit contains a sense resistor R and an operation amplifier 104. The voltage drop across the sense resistor R is fed into the operation amplifier 104 as an input for generating the first voltage signal $V_{D1}$. The temperature $T_{IC}$ of the integrated circuit 100, the ambient temperature $T_{air}$, and the reference temperature $T_{REF}$ are detected by the sensors 110, 112 and 114 to generate corresponding voltage signal $V_{IC}$, $V_{air}$, and $V_{REF}$, respectively. A differential amplifier 116 receives the voltage signals $V_{IC}$ and $V_{air}$ to generate a second voltage signal $V_{D2}$, while a differential amplifier 118 receives the voltage signal $V_{air}$ and $V_{REF}$ to generate the third voltage signal $V_{D3}$.

Figure 3:
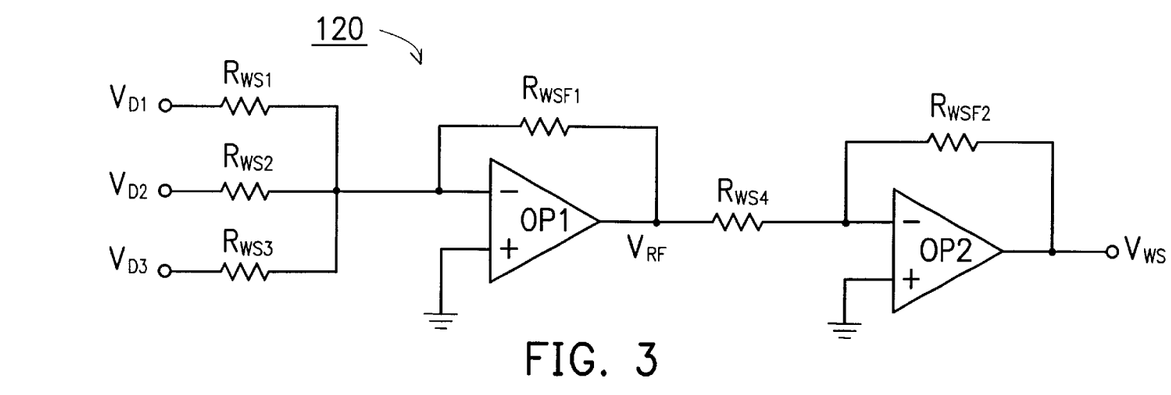
FIG. 3 is a diagram illustrating one operable circuit of the weighted summer as shown in FIG. 2.

In this embodiment, a weighted summer is used and described as an example of the adder 120. FIG. 3 shows a circuit diagram of a weighted summer 120. The weighted summer 120 receives the first, the second and the third voltage signals $V_{D1}$, $V_{D2}$ and $V_{D3}$ to generate a control signal $V_{WS}$.

Referring to both FIG. 2 and FIG. 3, the control means 130 comprises a control circuit 132 and a switch device 134. The control means 130 is electrically coupled to the adder 120. The switch means 134 can be switched on or off according to the control signal $V_{WS}$ provided by the adder 120 and the speed of the cooling fan 144. The cooling apparatus 140 comprises a driving circuit 142, the fan 144 and a fan speed inspection circuit 146. The cooling apparatus 140 is coupled to the control means 130 and the integrated circuit 100. Whenever the switch means 134 is on, the fan 144 of the cooling apparatus is activated.

Figure 4:
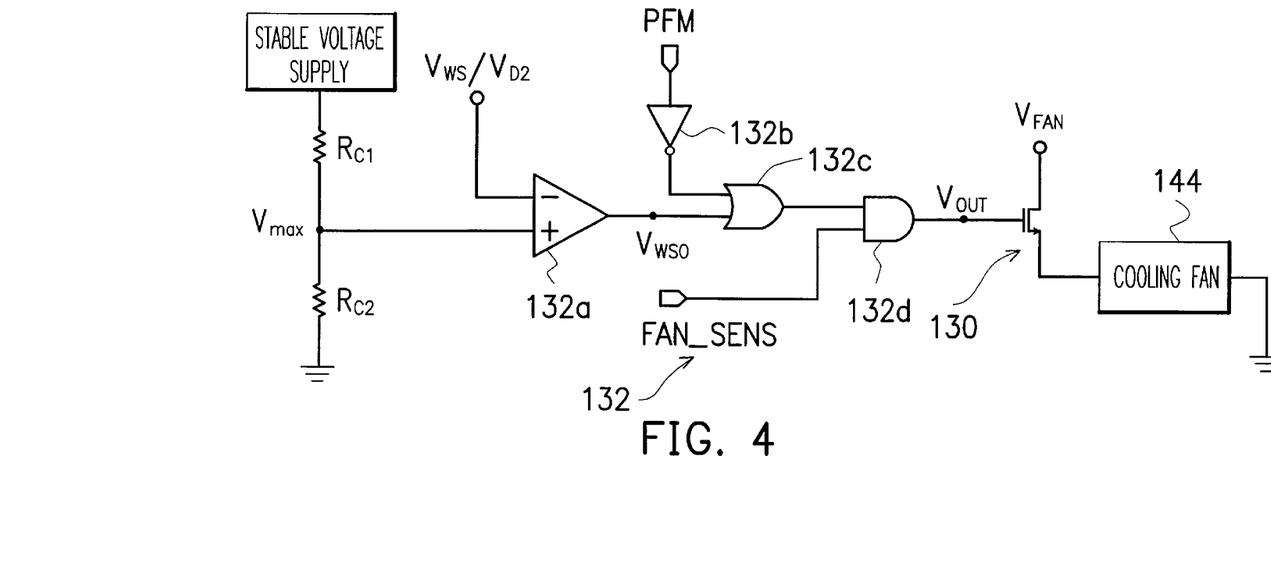
FIG. 4 circuit diagram illustrating the connection between the control means and the cooling fan means as shown in FIG. 2.

FIG. 4 is a diagram illustrating a connection between the control means 130 and the cooling fan 144 as shown in FIG. 2. As shown in FIG. 4, the control circuit 132 receives a reference voltage $V_{max}$, the control signal $V_{WS}$ output from the adder 120 and the speed FAN$_{13}$SENS of the cooling fan 144 to determine whether the cooling fan 144 is to be activated. The reference voltage $V_{max}$ corresponds to an allowed maximum weighted sum of the operation temperature difference for the integrated circuit 100 and the loading of the integrated circuit 100. At a weighted sum $V_{WS}$ below the allowed maximum value $V_{max}$, heat generated by the integrated circuit 100 can be dissipated by other means, for example, heat pipes without activating the cooling fan 144. However, if the voltage $V_{WS}$ exceeds this allowed maximum value $V_{max}$, the control means 130 switches on the switch means 134 to activate the cooling apparatus 140. At the same time, the speed of the cooling fan 144 is monitored by the fan speed inspection circuit 146 to generate a sense signal FAN$_{13}$SENS fed back to the control circuit 132. Such fan-control circuit is particularly applicable for portable electronic equipment (for example, a portable computer), because the portable computer does not have a continuous lasting power source. Continuous operation of the cooling fan shortens the operation life of the battery. When the portable computer is working under a low operation performance mode, or in an air-conditioned room, the central processing unit does not generate too much heat or the heat generated can be dissipated and carried by the low ambient temperature. The heat can be dissipated without the aid of the driving cooling fan.

Additionally, the control circuit 132 may also receive a performance mode (PFM) signal for controlling the speed of the cooling fan 144. Table 1 and Table 2 are lists of truth values corresponding to the output signal $V_{OUT}$ of the circuit shown in FIG. 4. Table 1 presents the condition when the cooling fan is operating normally and the signal $FAN_{13}SENS$ is HIGH, while Table 2 presents the condition when cooling fan is operating abnormally and the signal $FAN_{13}SENS$ is LOW.

Referring to FIG. 4, assuming that the $V_{max}$ is 4 volts, the comparator 132a receives the voltage signals $V_{max}$ and $V_{WS}$ to generate a comparison result $V_{WSO}$. When the voltage signal $V_{WS}$ is larger than the voltage signal $V_{max}$, provided that the performance mode of the system is normal, the voltage signal $V_{WSO}$ is a high level signal, that is, the signal PFM is HIGH. Under the circumstance that the cooling fan is operating normally, the signal $FAN_{13}SENS$ is also HIGH. Therefore, the output of a logic gate 132d is HIGH. Meanwhile, the truth value is true (T) in Table 1, so that the cooling fan 146 is switched on. The operation theory of the control circuit 132 can be referred to Table 1 and Table 2 for various conditions.

TABLE 1

|  |  | Performance Mode (PFM) | |
| --- | --- | --- | --- |
| FAN_SENS is HIGH |  | High Level | Low Level |
| $V_{WSO}$ | High Level | T | T |
| $V_{WSO}$ | Low Level | T | F |

|  |  | Performance Mode (PFM) | |
| --- | --- | --- | --- |
| FAN_SENS is HIGH |  | High Level | Low Level |
| $V_{WSO}$ | High Level | F | F |
| $V_{WSO}$ | Low Level | F | F |

In a second embodiment of this invention, a specific application of the cooling apparatus described in the first embodiment to portable electronic equipment, for example, a portable computer, is introduced.

Figure 5:
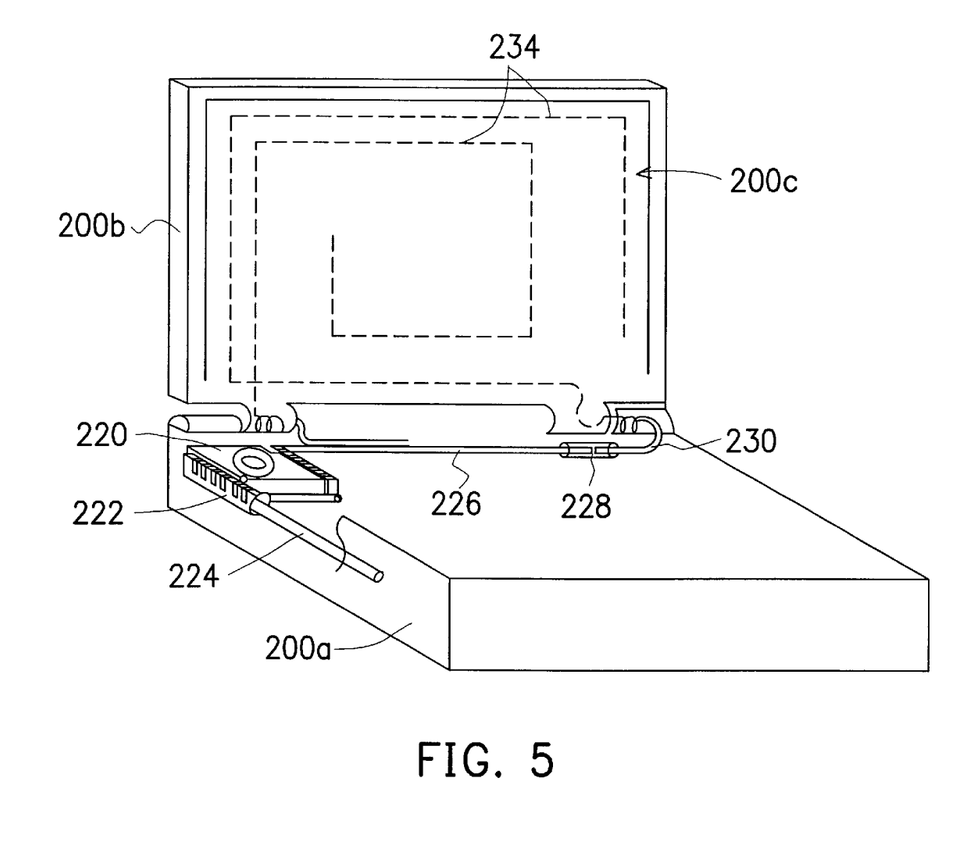
FIG. 5 shows a cooling apparatus in a portable computer according to a second embodiment of this invention.
Figure 6:
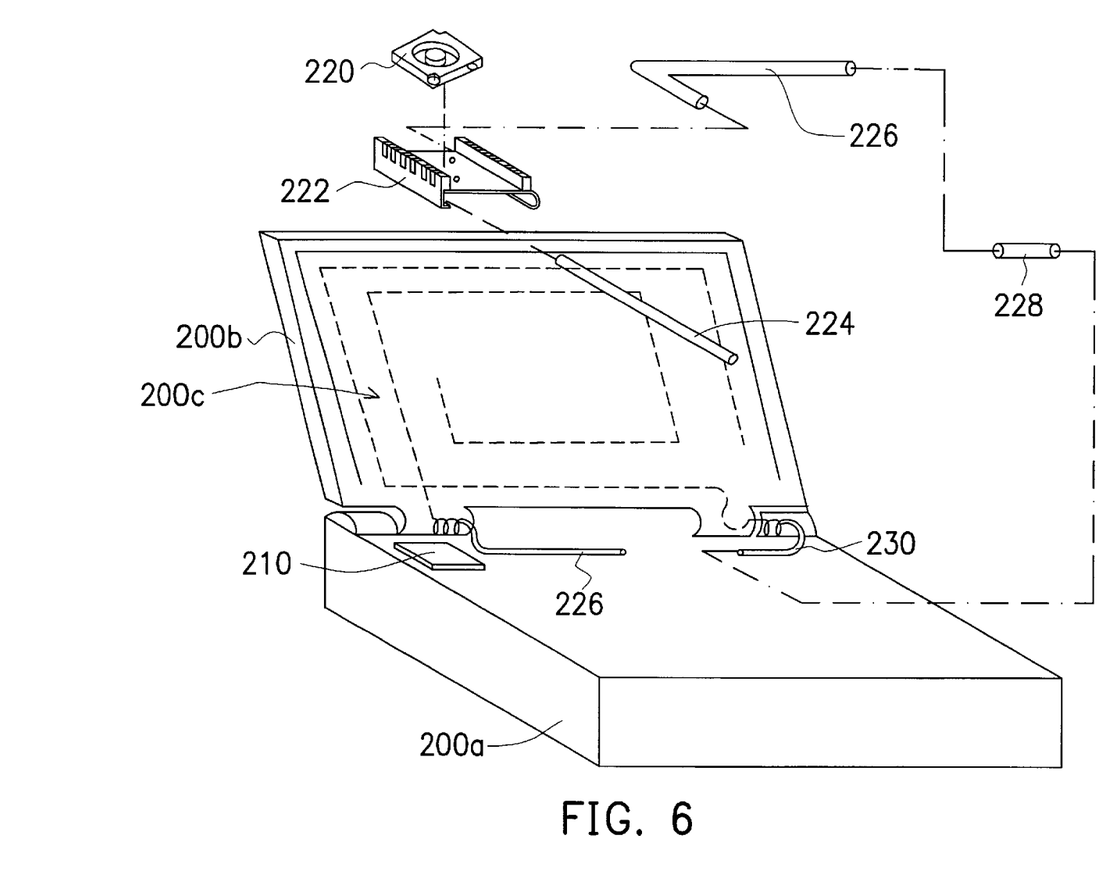
FIG. 6 is an exploded view showing relations between components in the cooling apparatus shown in FIG. 5.

Referring to both FIG. 5 and FIG. 6, a portable computer comprises an integrated circuit 210 which may be used as a central processing unit. This portable electronic equipment comprises a main body 200a used as an enclosure to assemble a mother board, a display 200b used to as an enclosure to assemble a screen 200c. The screen 200c may be a liquid crystal display (LCD) display. The portable computer further comprises cooling fan means, heat pipe means, and a driving circuit.

The cooling fan means are coupled the integrated circuit 210 for dissipating the heat generated by the integrated circuit 210. The cooling fan means further comprises a fan 220 and a heat sink 222. The heat pipe comprises at least a first heat pipe 224 and a second heat pipe 226. Both the first and the second heat pipes 224 and 226 are coupled to the heat sink 222 and the main body enclosure 200a. The main body enclosure 200a may be made of material such as metal, for example, aluminum alloy, aluminum-magnesium-copper alloy, aluminum-magnesium alloy, or other material, so that the heat generated by the integrated circuit 210 may be continuously directed to the heat pipes 224 and 226 via the heat sink 222 more effectively.

The driving circuit is used to control the speed of the cooling fan 220 according to the loading in the integrated circuit 210, the ambient temperature, the temperature of the integrated circuit 210 and a reference temperature. Since the overall design is the same as that in the first embodiment, detailed description is omitted here.

Furthermore, the operating mode of the portable computer can be changed accordingly by several means. Firstly, a special Hi/Lo pin can be assigned to the CPU, so that by sending a signal to the Hi/Lo pin of the CPU, the CPU can work in a high operating speed or a low operating speed. Secondly, as shown in FIG. 2, a system managing (SM) bus can be used to change the clocking frequency from a clocking chip 152 to the CPU 100. Hence, the performance of execution can be slowed down or fastened up depending on demand. However, the particular brand of CPU must be able to satisfy the phase lock loop requirement when the clocking frequency is changed. Thirdly, as shown in FIG. 2, when the STP clock pin of the CPU is at a low potential, the clock signal inside the CPU will stop. On the other hand, when the STP clock pin is at a high potential, the clock pulse signal inside the CPU will become normal again. Therefore, a logic gate connecting between the CPU and a chipset 150 such that a high potential or a low potential having a definite high/low timing ratio can be established. Hence, duty cycle of the CPU can be adjusted to achieve whatever rate of execution demanded.

Figure 7:
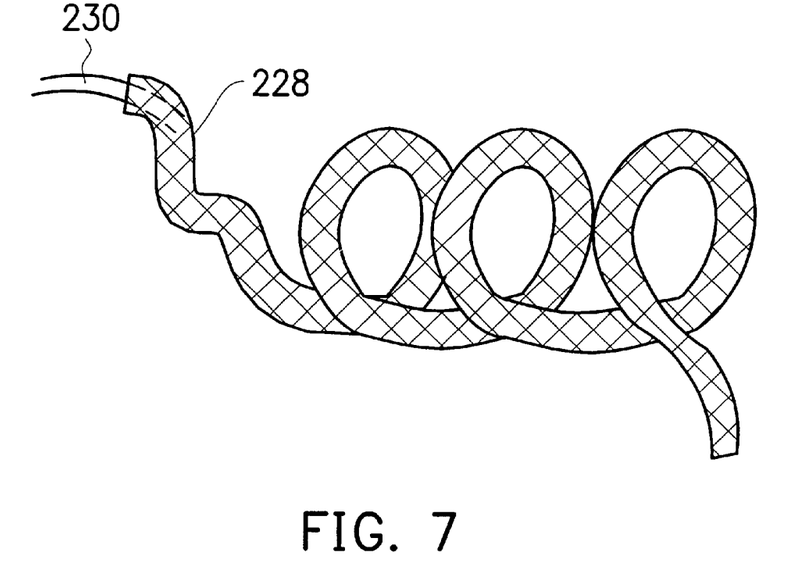
FIG. 7 is a schematic diagram showing the profiles of a metal cord and a metal sheath.
Figure 8:
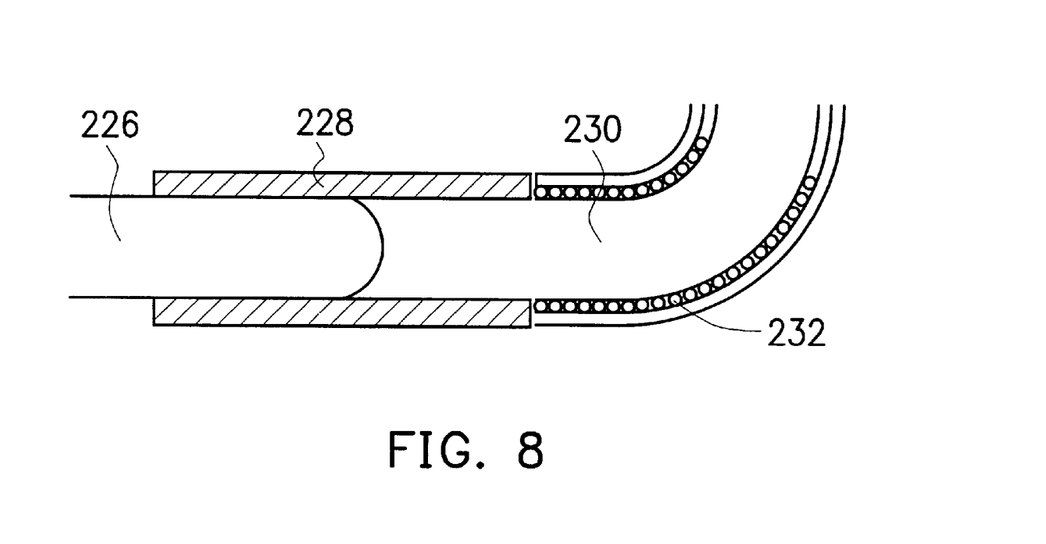
FIG. 8 is a cross-sectional view of the metal cord and the metal sheath as shown in FIG. 7.

Referring to both FIG. 7 and FIG. 8, schematic drawings of the heat pipe 226 connecting to a metal cord 230 are shown. The heat pipe 226 has one end connected to the metal cord 230 which is further covered by a metal sheath 228. A grease 232 is spread between the metal cord 230 and the metal sheath 228 to enhance the efficiency of heat dissipation. A metal cord 234 can further installed under the screen 200c. Using the metal cord, the heat can be dispelled via the metal enclosure more effectively.

The material of the heat sink comprises conductive metal. The heat sink may be formed with or without fins thereon. The types of fins comprise a pin type fin or plate type fin for increasing heat spreading area.

In the invention, the heat pipe further comprises an evaporation section, an adiabatic section and a condensation section. The water contained in the heat pipe absorbs heat to be vaporized into gas which flows through the adiabatic section into the condensation section to be cooled down to water. The condensed water then re-flows to the evaporation section using a wick structure. The wick structure can be a wire wick, a grooved wick, a mesh wick or a sintered power. The heat pipe may be in contact with the heat sink with or without a grease applied between each other. The heat pipe may be formed with a circle cross section, a rectangle cross section, or an ellipse cross section. The fan may be an axial-flow fan or a blower.

Thus, the invention adjusts the speed of cooling fan according to the loading of the integrated circuit, the temperature of the chip, the ambient temperature and a reference temperature. Therefore, the integrated circuit can work at a temperature within a tolerance without consuming too much power.

The cooling apparatus of this invention complies with the operating mode of the processor.

Furthermore, the cooling operation to the central processing unit of an integrated circuit is performed by a heat dissipating while the temperature of the integrated circuit is within a temperature tolerance. When the temperature of the integrated circuit is over a temperature limit, the fan is activated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cooling apparatus for cooling down an integrated circuit according to the load of the integrated circuit and a plurality of temperature parameters, the cooling apparatus comprising:

adder means, for receiving respectively a first input voltage signal, a second input voltage signal and a third input voltage signal and generating an output control signal, the first input voltage signal corresponding to the loading in the integrated circuit, the second input voltage signal corresponding to a difference between the ambient temperature and the temperature of the integrated circuit, and the third input voltage signal corresponding to the difference between the ambient temperature and the reference temperature;

cooling fan means, for cooling the integrated circuit; and control means, coupled to the adder means to control through a switch means and according to the output control signal of the adder means the speed of the cooling fan.

2. The cooling apparatus of claim 1, wherein the first voltage signal is generated by a load-detecting circuit comprising a sense resistor and an operation amplifier, wherein the operation amplifier receives a voltage drop across the sense resistor and generates the first voltage signal.

3. The cooling apparatus of claim 1, wherein the adder is a weighted summer.

4. The cooling apparatus of claim 1, wherein the integrated circuit is a microprocessor.

5. The cooling apparatus of claim 1, wherein the cooling fan means further comprising:

a fan;

a driving circuit, coupled to both the switch means and the fan for driving the fan; and a fan speed detecting circuit, for monitoring the speed of the fan and generating a fan sensing signal to the control means and the integrated circuit.

6. The cooling apparatus of claim 1, wherein the switch means is a transistor switch.

7. A cooling apparatus for cooling down an integrated circuit in a portable electronic device which has a main body and a display, comprising:

a cooling fan means, comprising a fan, a heat sink coupled to the integrated circuit;

heat pipe means, coupled to a heat sink;

a driving circuit, for controlling a speed of the cooling fan according to a loading in the integrated circuit, an ambient temperature, a temperature of the integrated circuit and a reference temperature, wherein the driving circuit comprises adder means for receiving a first, a second, and a third voltage signals and generating a control signal, the first voltage signal corresponds to the loading in the integrated circuit, the second voltage signal corresponds to the difference between the temperature of the integrated circuit and the ambient temperature, and the third voltage signal corresponds to the difference between the ambient temperature and the reference temperature; and control means, coupled to the adder means to control the speed of the cooling fan through a switch according to the control signal of the adder means.

8. The cooling apparatus of claim 7, wherein the first voltage signal is generated by a load-detecting circuit comprising a sense resistor and an operation amplifier, the operation amplifier receives a voltage drop across the sense resistor and generates the first voltage signal.

9. The cooling apparatus of claim 7, wherein the adder is a weighted summer.

10. The cooling apparatus of claim 7, wherein the integrated circuit is a central processing unit of the portable electronic device.

11. The cooling apparatus of claim 7, wherein the cooling fan means further comprises:

a fan speed detecting circuit, for monitoring the speed of the cooling fan and then generating a fan sensing signal to the control means and the integrated circuit.

12. The cooling apparatus of claim 7, wherein the switch means is a transistor switch.

13. The cooling apparatus of claim 7, wherein the heat pipe means further includes a first heat pipe and a second heat pipe, both of which are coupled to a heat sink and are in contact with an enclosure of the main body.

14. The cooling apparatus of claim 13, wherein the second heat pipe is further coupled to a metal cord.

15. The cooling apparatus of claim 14, wherein the metal cord is made of an alloy selected from a group consisting of copper, aluminum and magnesium.

16. The cooling apparatus of claim 14, wherein the metal cord coupled to the second heat pipe is covered by a metal sheath.

17. The cooling apparatus of claim 16, wherein a grease is coated between the metal cord and the metal sheath.

18. The cooling apparatus of claim 14, wherein the metal cord is installed at a backside of the display of the portable electronic device.

19. The cooling apparatus of claim 7, wherein the display panel section comprises a liquid crystal display (LCD) panel.

20. The cooling apparatus of claim 7, wherein the enclosure of the main body and the display of the portable electronic device are made of metal material.

21. The cooling apparatus of claim 20, wherein the enclosure of the metal material is selected from a group consisting of aluminum-magnesium alloy, aluminum alloy and aluminum-magnesium-copper alloy.

22. A cooling apparatus for cooling down an integrated circuit in a portable electronic device which has a main body and a display, comprising:

cooling fan means comprising: a fan, a heat sink coupled to the integrated circuit, a driving circuit coupled to both a switch device and the cooling fan for driving the fan, and a fan speed detecting circuit that monitors the speed of the cooling fan and then generates a fan sensing signal to the control device and the integrated circuit;

heat pipe means including at least a first heat pipe and a second heat pipe, both being coupled to a heat sink and are in contact with an enclosure of the main body; and wherein the driving circuit controls the speed of the cooling fan according to the loading of the integrated circuit and a plurality of temperature parameters, the driving circuit comprising: adder means which from receiving a plurality of input voltage signals reflecting the loading of the integrated circuit and variations of the plurality of the temperature parameters generate an output control signal, and control means which, coupled to the adder means, controls the speed of the fan through a switch means and according to the control signal of the adder means.

23. The cooling apparatus of claim 22, wherein the adder is a weighted summer.

24. The cooling apparatus of claim 22, wherein the integrated circuit is a central processing unit of the portable electronic device.

25. The cooling apparatus of claim 22, wherein the switch means is a transistor switch.

26. The cooling apparatus of claim 22, wherein the second heat pipe is further coupled to a metal cord.

27. The cooling apparatus of claim 26, wherein the metal cord is made of an alloy selected from a group consisting of copper, aluminum and magnesium.

28. The cooling apparatus of claim 26, wherein the metal cord coupled to the second heat pipe is covered by a metal sheath.

29. The cooling apparatus of claim 28, wherein a grease is coated between the metal cord and the metal sheath.

30. The cooling apparatus of claim 26, wherein the metal cord is installed at a backside of the display of the portable electronic device.

31. The cooling apparatus of claim 22, wherein the enclosure of the main body and the display of the portable electronic device is made of metal material.

32. The cooling apparatus of claim 31, wherein the enclosure of the metal material is selected from a group consisting of aluminum-magnesium alloy, aluminum alloy and aluminum-magnesium-copper alloy.

33. The cooling apparatus of claim 22, wherein the display panel section comprises a liquid crystal display (LCD) panel.

34. The cooling apparatus of claim 22, wherein the adder means receives three input voltage signals, wherein the first, second and third input voltage signals correspond respectively to a loading in the integrated circuit, a difference between the temperature of the integrated circuit and the ambient temperature, and a difference between the ambient temperature and the reference temperature.

35. The cooling apparatus of claim 34, wherein the first input voltage signal is generated by a load-detecting circuit comprising a sense resistor and an operation amplifier, the operation amplifier receives a voltage drop across the sense resistor and generates the first voltage signal.

36. A cooling apparatus for cooling down an integrated circuit according to the loading of the integrated circuit and a plurality of temperature parameters, comprising:

adder means which, from receiving a plurality of input voltage signals reflecting the loading of the integrated circuit and variations of the plurality of the temperature parameters generate an output control signal;

cooling fan means that comprises: a fan, a driving circuit coupled to both a switch means and the fan for driving the fan, and a fan speed detecting circuit that monitors the speed of the fan and generates a fan sensing signal to a control means and the integrated circuit;

control means which is coupled to the adder means and controls the speed of the cooling fan through a switch means and according to the control signal of the adder means.

37. The cooling apparatus of claim 36, wherein the adder means receives three input voltage signals, wherein the first, second and third input voltage signals correspond respectively to a loading in the integrated circuit, a difference between the temperature of the integrated circuit and the ambient temperature, and a difference between the ambient temperature and the reference temperature.

38. The cooling apparatus of claim 37, wherein the first input voltage signal is generated by a load-detecting circuit comprising a sense resistor and an operation amplifier, wherein the operation amplifier receives a voltage drop across the sense resistor and generates the first voltage signal.

39. The cooling apparatus of claim 36, wherein the adder is a weighted summer.

40. The cooling apparatus of claim 36, wherein the integrated circuit is a microprocessor.

41. The cooling apparatus of claim 36, wherein the switch means is a transistor switch.

* * * * *